United States Patent
Fuderer

(10) Patent No.: US 8,244,011 B2
(45) Date of Patent: Aug. 14, 2012

(54) ARTIFACT SUPPRESSION IN MULTI-COIL MRI

(75) Inventor: Miha Fuderer, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 752 days.

(21) Appl. No.: 12/374,321

(22) PCT Filed: Jul. 3, 2007

(86) PCT No.: PCT/IB2007/052588
§ 371 (c)(1),
(2), (4) Date: Jan. 19, 2009

(87) PCT Pub. No.: WO2008/010126
PCT Pub. Date: Jan. 24, 2008

(65) Prior Publication Data
US 2009/0257629 A1    Oct. 15, 2009

(30) Foreign Application Priority Data

Jul. 18, 2006  (EP) .................................... 06117393

(51) Int. Cl.
*G06K 9/00* (2006.01)
(52) U.S. Cl. ......................... 382/128; 382/275; 600/410
(58) Field of Classification Search .................. None
See application file for complete search history.

(56) References Cited

U.S. PATENT DOCUMENTS

| 6,160,398 A | 12/2000 | Walsh |
| 2005/0237059 A1 | 10/2005 | Reykowski |

FOREIGN PATENT DOCUMENTS

WO    2004077086 A1    9/2004

OTHER PUBLICATIONS

Wang, J-J., et al.; Selective averaging for the diffusion tensor measurement; 2005; Magnetic Resonance Imaging; 23:585-590.
Walsh, D. O., et al.; Adaptive Reconstruction of Phased Array MR Imagery; 2000; MRM; 43:682-690.
Weerasinghe, C., et al.; ROI Extraction from Motion Affected MR Images by Suppression of Blurring and Motion Artifacts in the Image Background; 1999; Trans. of 5th Int'l Symposium on Signal Processing and its Applications; pp. 279-282.
Pruessmann, K. P., et al.; SENSE: Sensitivity Encoding for Fast MRI; 1999; MRM;42:952-962.

*Primary Examiner* — Hrayr A Sayadian

(57) ABSTRACT

A magnetic resonance imaging system (1), comprising a plurality of receiving units (4.1-4.4) for receiving magnetic resonance signals from an object (2), and an image reconstruction device (8), said image reconstruction device being adapted to receive magnetic resonance signals of said object (2) from said plurality of receiving units (4.1-4.4) and to perform image reconstruction by combining magnetic resonance signals received by said plurality of receiving units using an image reconstruction algorithm (11), characterized in that said image reconstruction device (8) comprises means (12a) for combining magnetic resonance signal contributions from respective receiving units (4.1-4.4) in such a way that a combined sensitivity of the plurality of receiving units (4.1-4.4) to a predetermined spatial region of the object (2) is reduced.

6 Claims, 3 Drawing Sheets

ARTIFACT SUPPRESSION IN MULTI-COIL MRI

BACKGROUND OF THE INVENTION

The present invention relates to a magnetic resonance imaging system, comprising a plurality of receiving units for receiving magnetic resonance signals from an object, further comprising an image reconstruction device, said image reconstruction device being adapted to receive magnetic resonance signals of said object from said plurality of receiving units and to perform image reconstruction by combining magnetic resonance signals received by said plurality of receiving units using an image reconstruction algorithm.

The present invention also relates to a method of image reconstruction in a magnetic resonance imaging system, comprising receiving magnetic resonance signals of an object from a plurality of receiving units and performing image reconstruction by combining magnetic resonance signals received by said plurality of receiving units by means of an image reconstruction algorithm.

The present invention further relates to a computer program product, particularly for storing on a computer-readable storage means, for use in a magnetic resonance imaging system, and more particularly for upgrading an existing magnetic resonance imaging system, said computer program product comprising first code sequences for implementing a mechanism for receiving magnetic resonance signals of an object from a plurality of receiving units and second code sequences for implementing an image reconstruction algorithm performing image reconstruction by combining magnetic resonance signals received by said plurality of receiving units.

In magnetic resonance imaging (MRI) it frequently happens that a region which is not of clinical interest disseminates artefacts over clinically interesting regions. For instance, the aorta may disseminate flow artefacts, i.e., a particular form of motion artefacts, onto the liver. In much the same way, the breast or the heart may cause artefacts over the spine due to their respective motions.

A prior art approach to obviating generation of the above-mentioned artefacts consists in employing a Regional Saturation Technique (REST) which involves applying a so-called saturation pulse to a problematic, i.e. moving area of an object to be imaged, in particular a human body. This technique is well known in the art and effectively prevents object atoms in said problematic area to emit magnetic resonance signals.

However, said technique is often bound to geometrical restrictions, because performing pre-saturation in regions other than straight slabs is usually impractical. Furthermore, the above-described prior art approach suffers from serious drawbacks in terms of scan time, attainable repetition rate, etc. In addition, due to said saturation pulses an amount of radiation absorbed by the patient is increased.

OBJECT OF THE INVENTION

It is the object of the present invention to provide a magnetic resonance imaging system as well as a method of the above-mentioned type which enable obtaining high-quality magnetic resonance images from an object, e.g. a patient, which do not suffer from artefacts caused by any kind of instability, e.g. motion or other local effects, which occur with respect to a limited portion of an object under study, and which are not bound to geometrical restrictions.

SUMMARY OF THE INVENTION

According to a first aspect of the present invention the object is achieved by providing a magnetic resonance imaging system of the above-mentioned type, wherein said image reconstruction device comprises means for combining magnetic resonance signal contributions from respective receiving units in such a way that a combined sensitivity of the plurality of receiving units to a predetermined spatial region of the object is reduced.

According to a second aspect of the present invention the object is achieved by providing a computer program product of the above-mentioned type which comprises further code sequences for implementing a mechanism for combining magnetic resonance signal contributions from respective receiving units in such a way that a combined sensitivity of the plurality of receiving units to a predetermined spatial region of the object is reduced.

According to a third aspect of the present invention the object is achieved by providing a method of the above-mentioned type which comprises the step of combining magnetic resonance signal contributions from respective receiving units in such a way that a combined sensitivity of the plurality of receiving units to a predetermined spatial region of the object is reduced.

Thus, by employing a magnetic resonance signal acquisition system comprising a plurality of receiving elements, which may also be used to perform parallel Magnetic Resonance Imaging (pMRI), the problem of artefact images can be solved by simply modifying the image reconstruction or coil combination algorithm such that the result of said algorithm shows minimum sensitivity to a predefined region or area of the object which is known to be problematic with respect to image reconstruction, for instance due to intrinsic motion of said region or area. In this way, magnetic resonance imaging, e.g. parallel magnetic resonance imaging, allows for intrinsically avoiding image artefacts.

For instance, assume a first coil located in front of the object (patient) and a second coil located behind the object (patient). Said first coil has a spatial sensitivity of 2 (in arbitrary units) at a first region of the object (e.g. the patient's heart) and a spatial sensitivity of 1 at a second region of the object (e.g. the patient's spine). The second coil has a spatial sensitivity of 2 (in arbitrary units) at the first region of the object and a spatial sensitivity of 2 at the second region of the object. If the second region (the spine) is of interest for a particular study, then in accordance with an embodiment of the present invention the first and second coils, i.e. their respective signal contributions, should be combined subtractively, thus yielding zero sensitivity, i.e. a reduced or relatively lower sensitivity, at the first region of the object, which is presumed to disseminates artefacts over the more interesting second region.

In one embodiment of the invention a user may indicate an area known for causing motion or other kinds of artefacts. This approach has some similarity to placing REST slabs known from the prior art, wherein placing of said slabs is also planned by the user. However, since artefacts are avoided by modification of the image reconstruction algorithm only, there is no restriction of region geometry to slab-like structures. Furthermore, assuming that acquired magnetic resonance raw data is kept in memory, defining said region can be done either before or after the actual acquisition process, thus making the inventive approach highly flexible during practical operation. Additionally, the avoidance of REST slabs has the advantage of reducing the amount of radiated power to which an object, e.g. a patient, is exposed.

In a corresponding embodiment of the computer program product in accordance with the present invention the latter further comprises code sequences for implementing a mechanism for receiving input data for geometrically defining said region before or after measuring said magnetic resonance signals.

In one embodiment of the magnetic resonance imaging system in accordance with the present invention, said image reconstruction device of the latter comprises means for estimating image data points p by evaluating the expression $$p=(S^h\Psi'^{-1}S)^{-1}S^h\Psi'^{-1}m, \quad (\text{Eq. 1})$$

with $\Psi'=\Psi+\Psi_{instability}$, wherein m is a vector with measured magnetic resonance data per receiving unit, S is an array of receiving unit or coil sensitivities, $S^h$ is the hermitian transpose of S, $\Psi$ is a noise covariance matrix, and $\Psi_{instability}$ is an additional term accounting for a motion or any kind of local instability of the object.

Departing from the known image reconstruction algorithm $$p=(S^h\Psi^{-1}S)^{-1}S^h\Psi^{-1}m$$

this provides for improving the prior art as desired. Furthermore, this approach particularly lends itself for upgrading an existing magnetic resonance imaging system, e.g. by providing and implementing suitable software modules.

Said approach is valid for parallel imaging as well. Then, in analogy to Pruessmann et al. (Magn. Reson. Med. 1999; 42: pp. 952-962), p becomes a vector and S becomes a matrix.

In a corresponding embodiment of the computer program product in accordance with the present invention the latter further comprises program code sequences for implementing a mechanism for estimating image data points by evaluating the above-defined Eq. 1.

In a corresponding further embodiment, the method in accordance with the present invention further comprises estimating image data points by evaluating the above-defined Eq. 1.

In yet another embodiment of the magnetic resonance imaging system in accordance with the present invention, said image reconstruction device of the latter comprises means for determining said additional term (matrix $\Psi_{instability}$) according to the relation:

$$\Psi_{instability,ik} = a \cdot 1/A \cdot \sum_{area} s_i(x,y) s_k(x,y) \|q(x,y)\|^2, \quad (\text{Eq. 2})$$

wherein $\Psi_{instability,ik}$ are matrix elements of said additional term, A is a quantity of said predetermined spatial region of the object, q(x,y) is a signal strength of a reference signal, $s_i(x,y)$, $s_k(x,y)$ is a sensitivity of receiving unit i, k at image position (x,y), respectively, and a is a predefined numerical factor. Furthermore, x and y denote spatial coordinates in the 2D image plane.

In a further embodiment of the computer program product in accordance with the present invention the latter further comprises code sequences for implementing a mechanism for determining said additional term according to the above-defined Eq. 2. In another embodiment the computer program product in accordance with the present invention may further comprise program code sequences for implementing a mechanism for including said additional term in said image reconstruction algorithm.

In a corresponding embodiment, the method in accordance with the present invention further comprises determining said additional term according to the above-defined Eq. 2. In another embodiment the method in accordance with the present invention may further comprise including said additional term in said image reconstruction algorithm.

Using the inventive approach in connection with pMRI further reduces scan time and the amount of radiation absorbed by the object (patient).

Further advantages and characteristics of the present invention can be gathered from the following description of preferred embodiments with reference to the appended drawings. Features mentioned above as well as below can be used either individually or in conjunction in the context of the present invention. The described embodiments are not to be regarded as an exhaustive enumeration but rather as examples with respect to a basic concept underlying the present invention.

Note that while embodiments of the present invention will hereinafter be described primarily with respect to avoiding motion artefacts, any other kind of artefact caused by local instabilities could also be avoided in a similar fashion. Beside the above-mentioned flow artefacts, system instabilities caused by a pronounced off-centre location of some part of an object under study or by differences in brightness of some part of the object may be of relevance here.

DETAILED DESCRIPTION

Figure 1:
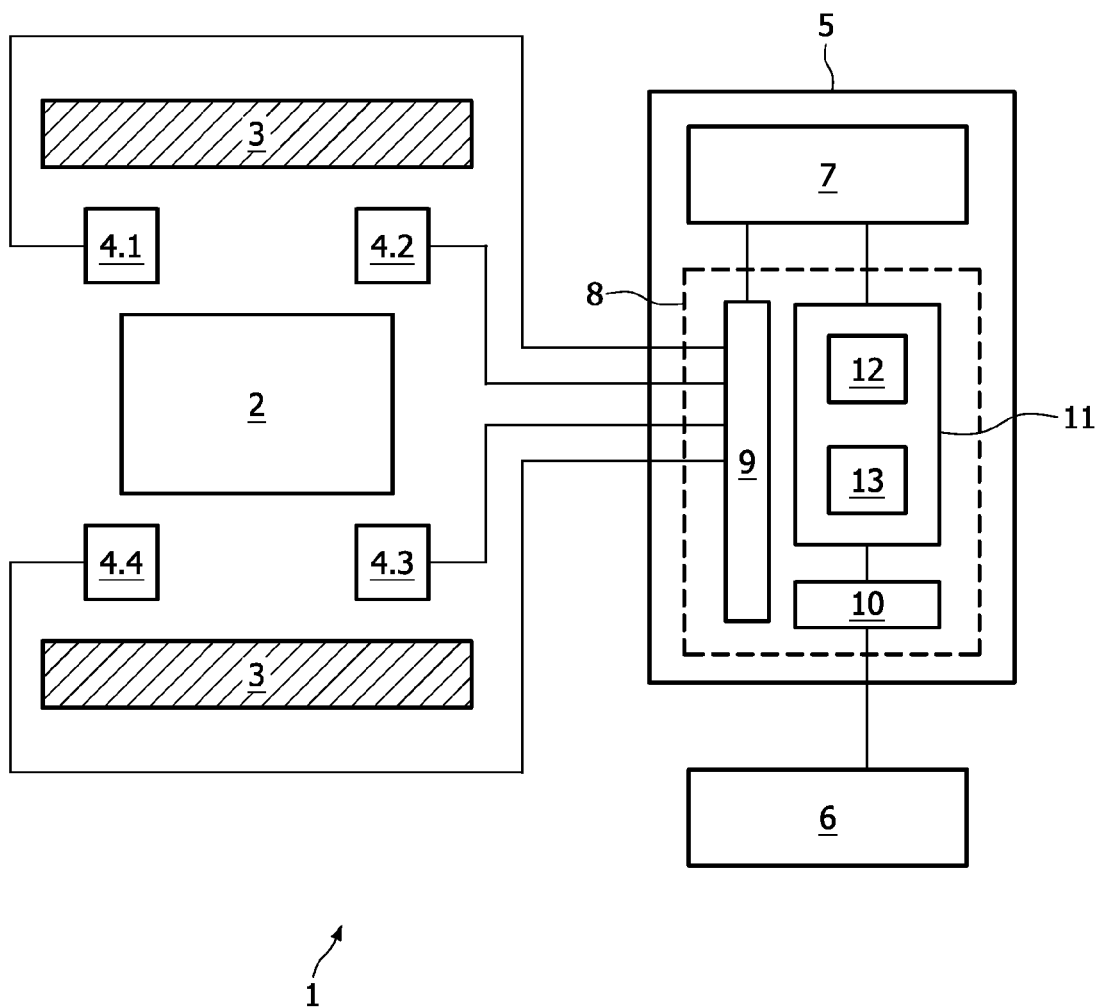
FIG. 1 is a schematic block diagram of a magnetic resonance imaging system comprising an image construction device in accordance with the present invention.

FIG. 1 shows a block diagram of a magnetic resonance imaging system 1 in accordance with the present invention. For providing magnetic resonance images of an object 2, e.g. a patient, said system 1 comprises a main magnet 3 producing a strong magnetic field in which object 2 is placed for magnetic resonance imaging, as known to a person skilled in the art. Said magnetic field is a uniform magnetic field that causes an alignment of the moments of magnetic spin of atoms contained within the object. As further known to a person skilled in the art, system 1 further comprises a number of functional units (not shown) that apply a transverse magnetic field, generated by radio frequency (RF) pulses, to the object such that the aligned moments rotate or tip, thereby exciting the spins of the atoms. The excited spins of the atoms generate a magnetic resonance signal that is detected by a plurality of receiving units 4.1-4.4 (receiving or imaging coils) comprised within the magnetic resonance imaging system 1.

The magnetic resonance imaging system 1 of FIG. 1 further comprises a control unit 5 which is operatively connected with an input unit 6, and which generally comprises storage means 7 and an image reconstruction device 8 (dashed box in FIG. 1). The latter is preferably devised in software form, e.g. by implementing suitable program code sequences on said control unit 5.

Image reconstruction device 8 comprises first receiving means 9 for receiving said magnetic resonance signals of object 2 from said receiving units 4.1-4.4. Image reconstruction device 8 further comprises second receiving means 10 for receiving input data from input unit 6. Image reconstruction device 8 further includes an algorithmic unit 11 having further means 12, 12a, and 13, a function of which will be described in detail below.

As known to a person skilled in the art, during operation of the magnetic resonance imaging system 1 of FIG. 1, receiving units 4.1-4.4 provide magnetic resonance data of object 2. Said data, i.e. corresponding magnetic resonance signals, are received by first receiving means 9 of control unit 5/image reconstruction device 8. Using multiple receiver coils 4.1-4.4 each with different (and known) spatial sensitivities allows reconstructing of the magnetic resonance image of object 2 by employing a suitable image reconstruction algorithm as provided by algorithmic unit 11 of FIG. 1. To this end, data received by first receiving means 9 preferably is first stored (at least temporarily) in storage means 7 and then provided to algorithmic unit 11 for image reconstruction.

Image reconstruction is based on the above-defined algorithm (e.g., as defined by Eqs. 1 and 2) which is implemented by means of algorithmic unit 11 for operating on said magnetic resonance signal raw data provided by first receiving means 9 and/or storage means 7, as previously described.

As already stated above, a suitable image reconstruction algorithm can be written as:

$$p=(S^h\Psi^{-1}S)^{-1}S^h\Psi^{-1}m,$$

wherein m is a vector with the measured data per coil element i (4.1-4.4), p is an estimated of image data point (or a vector of image data points in the case of parallel imaging), S is an array of coil sensitivities matrix ($s_i(x,y)$ being the sensitivity of coil i at image position (x, y)), $S^h$ is the hermitian transpose (transposed complex conjugate) of S, and $\Psi$ is the noise covariance matrix ($\Psi_{ii}$ being the square of the noise deviation of coil element i).

As already pointed out the above-defined reconstruction algorithm generally can be used for parallel and non-parallel imaging, wherein non-parallel imaging is regarded as a limiting case with a speed-up factor equal to unity. In the case of non-parallel imaging, p is a scalar and S is a 1*N matrix, N being the number of receiving units (coils) used. As for parallel imaging, $\Psi$ is an N*N matrix.

Figure 2:
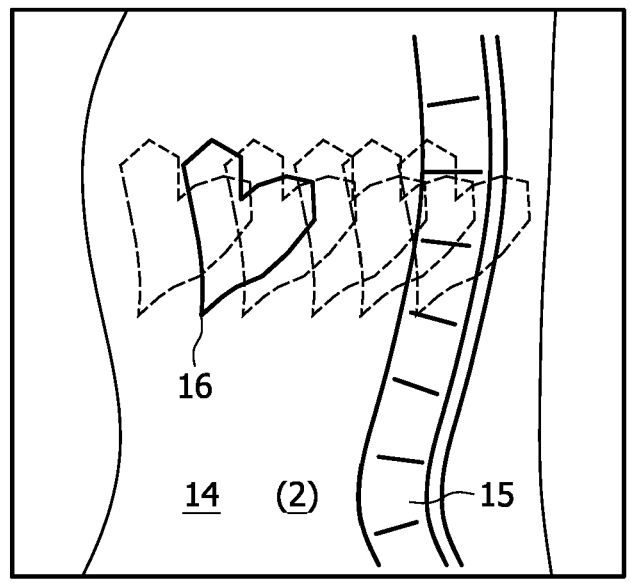
FIG. 2 is a schematic diagram for illustrating the effect of heart motion troubling spine-imaging.

As already stated above, in MRI it frequently happens that a region that is not of (clinical) interest disseminates artefact over (clinically) interesting regions of an object to be studied. In medical MRI, one typical example is the aorta which disseminates flow artefacts onto the liver. Another typical example is the breast or the heart which—due to their respective motion—may cause artefacts over the spine. The latter case is schematically illustrated in FIG. 2:

FIG. 2 schematically shows a sagittal view through a human body 14 including the spine 15, which presently is of clinical interest, and the heart 16, which is not of interest in that particular study.

When using the magnetic resonance imaging system 1 as described so far with reference to appended FIG. 1 motion artefact data in the magnetic resonance signals provided by receiving units 4.1-4.4 (FIG. 1) would result in motion artefacts being present in the reconstructed image data provided by image reconstruction device 8, i.e. algorithmic unit 11.

In order to obviate this effect, the image reconstruction device 8/algorithmic unit 11 of the magnetic resonance imaging system 1 in accordance with the present invention further comprises (software) means 12a for combining magnetic resonance signal contributions from respective receiving units 4.1-4.4 in such a way that a combined sensitivity of the plurality of receiving units is relatively lower, i.e. reduced, to a predetermined spatial region of the object 2, as previously described in connection with first and second receiving coils located in front of and behind an object, respectively. In other words: Said receiving coils are combined in such a way that the combination shows little or no sensitivity to an area of the object, in particular to an area which is suspected to cause artefacts in the resulting magnetic resonance image.

Alternatively or additionally, the image reconstruction device 8/algorithmic unit 11 of the magnetic resonance imaging system 1 in accordance with the present invention may comprise (software) means 12 for including in the above-defined image reconstruction algorithm an additional term $\Psi_{instability}$ which accounts for a motion of a predetermined spatial region of object 2. Furthermore, according to the embodiment of FIG. 1, image reconstruction device 8/algorithmic unit 11 further comprises means 13 for determining said additional matrix term $\Psi_{instability}$ according to the relation:

$$\Psi_{instability,ik} = a \cdot 1/A \cdot \sum_{area} s_i(x,y)s_k(x,y)\|q(x,y)\|^2,$$

wherein $\Psi_{instability,ik}$ is a matrix element of said extra term $\Psi_{instability}$, A refers to an area of said predetermined spatial region (region of motion) of the object, and a is a (user-defined) factor indicating an expected quantitative amount of motion artefacts. The value of a should be chosen in accordance with a "motion quality" of the moving object, e.g. the heart 16 in the example of FIG. 2, and should be essentially unity if the moving object is known to be very jerky and unpredictable. Furthermore, q(x,y) is an amount of signal (signal strength) measured by a reference coil (not shown in FIG. 1) during a reference scan for correctly adjusting an algorithmical impact of the proposed additional term $\Psi_{instability}$ in accordance with the present invention.

In this way, the reconstruction algorithm employed in the context of the present invention as implemented by means of algorithmic unit 11 comprising said addition term determining means 13 and additional term including means 12 is given by:

$$p=[S^h(\Psi+\Psi_{instability})^{-1}S]^{-1}S^h((\Psi+\Psi_{instability})^{-1}m.$$

Figure 3:
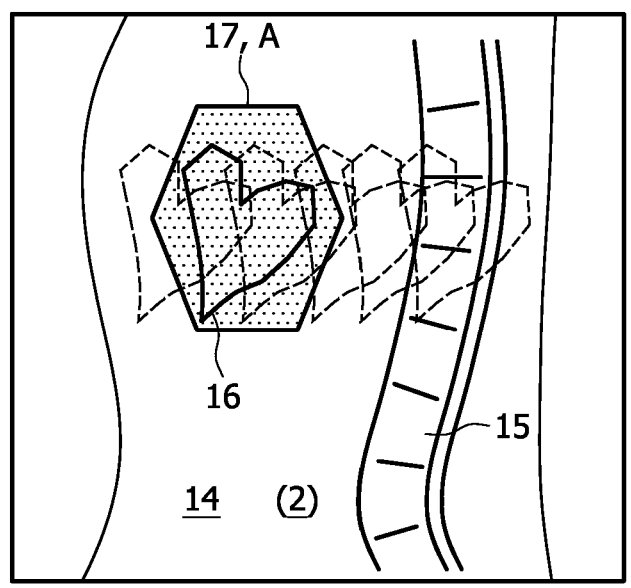
FIG. 3 is a schematic diagram illustrating a defined region for obviating motion-induced artefacts in accordance with the present invention.

FIG. 3 shows a schematic diagram illustrating a defined region for obviating motion-induced artefacts in accordance with the present invention. In FIG. 3, the same reference numerals are used for the same or similar elements as in FIG. 2. Additionally, in FIG. 3 said user-defined region of, for instance, hexagonal shape and area A is denoted by means of reference numeral 17. The small (cross-like) symbols inside region 17 of FIG. 3 illustrate individual locations within area A (generally corresponding to said region 17) in terms of image position coordinates (x, y). Thus, coil sensitivities $s_i(x,y)$ at each of said locations (x, y) within region 17 are used to determine the matrix elements $\Psi_{instability,ik}$ of the additional term $\Psi_{instability}$, as defined above.

In accordance with the present invention, region 17 can be defined prior to acquisition of magnetic resonance data by means of receiving units 4.1-4.4. Alternatively, the acquired magnetic resonance raw data is stored in storage means 7, region 17 may also be defined after said magnetic resonance data acquisition.

In the embodiment of FIG. 1, input unit 6 is preferably used for providing geometrical data descriptive of said region 17 to image reconstruction device 8/algorithmic unit 11 through said second receiving means 10.

In all embodiments of the present invention, an image reconstruction may first be performed without including said additional term $\Psi_{instability}$ in algorithmic unit 11. Then, following inspection of the reconstructed image data, for instance on a displaying unit (not shown) connected with control unit 5, user may identify a moving region of object 2, e.g. region 17 (heart 16) of the human body 14, such that image reconstruction can be re-performed by image reconstruction device 8/algorithmic unit 11 involving determining and including the additional term $\Psi_{instability}$ through means 12 and 13, respectively, as previously described.

For this reason, the approach proposed in the context of the present invention can also be referred to as "post-scan REST" which achieves the advantages of conventional REST (Regional Saturation Technique) without suffering from drawbacks associated with conventional REST, in particular in terms of scan time, attainable repetition rate and limitation to saturation geometries in the form of straight slabs. In this way, radiation exposure of the object (patient) can be reduced.

In this context, the present invention makes use of the fact that magnetic resonance imaging using a plurality of receiving units with different spatial sensitivities allows for intrinsically avoiding image artefact by proposing a suitable coil combination algorithm (see above) according to which the employed plurality of receiving units, in combination, shows only minimal sensitivity to an area A (region 17 in FIG. 3) which is known to be problematic in the context of acquiring/reconstructing magnetic resonance images. This approach can be used with both parallel and non-parallel imaging techniques.

Figure 4:
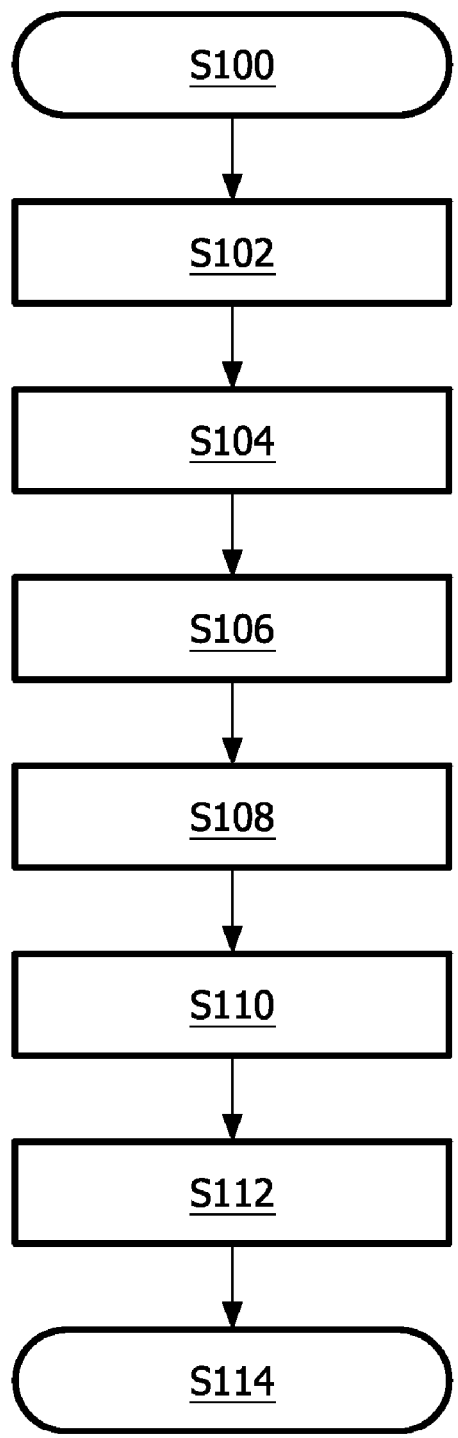
FIG. 4 is a flow chart for illustrating an embodiment of the method in accordance with the present invention.

FIG. 4 shows a flow chart for illustrating an embodiment of the method in accordance with the present invention. The method starts with step S100. In subsequent step S102 a reference scan is performed by means of a reference coil (not shown) comprised in the system 1 of FIG. 1 in order to determine the quantity q(x,y), as defined above. Said quantity can be stored in storage means 7.

Then, in step S104 magnetic resonance raw data is acquired by said plurality of receiving units by sampling the k-space, as known to a person skilled in the art. Preferably, the acquired raw data is also stored in storage means 7.

Then, in step S106 a region of the object, which is expected to move or to have moved, is defined by a user, possibly after inspection of a first image reconstructed from said raw data, as previously described. Note that in accordance with the invention steps S104 and S106 could be reversed in order, i.e. said region is defined prior to acquiring/storing magnetic resonance data.

Having defined said region, in step S108 the additional term is determined in the form of matrix $\Psi_{instability}$, as defined above, and is included in the reconstruction algorithm in subsequent step S110.

Then, in subsequent step S112 a desired magnetic resonance image is reconstructed from the acquired raw data by means of the proposed novel algorithm, thus effectively obviating the impact of motion artefacts.

The inventive method terminates with step S114.

The invention claimed is:

1. A method of image reconstruction in a magnetic resonance imaging system, comprising:
   receiving magnetic resonance signals of an object with a plurality of receiving units, each receiving unit having a corresponding spatially variant sensitivity;
   combining magnetic resonance signal contributions from respective receiving units in such a way that a combined sensitivity of the plurality of receiving units is relatively lower in a predetermined spatial region of the object, to account for motion in said predetermined spatial region; and
   using an image reconstruction algorithm, reconstructing the combined magnetic resonance signal contributions into an image in which artifacts due to motion in the predetermined region are reduced.

2. The method of claim 1, further comprising:
   estimating image data points of the reconstructed image by evaluating the expression:
   $$p=(S^h\Psi'^{-1}S)^{-1}S^h\Psi'^{-1}m,$$
   with $\Psi'=\Psi+\Psi_{instability}$, wherein m is a vector with measured magnetic resonance data per receiving unit, S is an array of receiving unitsensitivity matrix, $S^h$ is the hermitian transpose of S, $\Psi$ is a noise covariance matrix, and $\Psi_{instability}$ is said additional term accounting for an instability of said predetermined spatial region of the object.

3. The method of claim 2, further including:
   additionally accounting for motion in said predetermined spatial region by including said additional term ($\Psi_{instability}$) in said image reconstruction algorithm.

4. The method of claim 2, further comprising:
   determining said additional term ($\Psi_{instability}$) according to the relation:
   $$\Psi_{instability,ik} = a \cdot 1/A \cdot \sum_{area} s_{ij}(x,y)s_{kj}(x,y)\|q(x,y)\|^2,$$
   wherein $\Psi_{instability,ik}$ are matrix elements of said additional term, A is a quantity of said predetermined spatial region of the object, q(x,y) is a signal strength of a reference signal, $s_i(x,y)$, $s_k(x,y)$ is a sensitivity of receiving unit i, k at image position (x,y), respectively, and a is a predefined numerical factor.

5. A non-transitory computer readable medium carrying software for controlling one or more processors to perform the method of claim 1.

6. A magnetic resonance imaging system comprising:
   a plurality of receiving units which receive magnetic resonance signals;
   a processor programmed to perform the method of claim 1;
   a display on which the reconstructed image is displayed.

* * * * *